(12) United States Patent
Frosien et al.

(10) Patent No.: US 7,468,517 B2
(45) Date of Patent: Dec. 23, 2008

(54) SINGLE STAGE CHARGED PARTICLE BEAM ENERGY WIDTH REDUCTION SYSTEM FOR CHARGED PARTICLE BEAM SYSTEM

(75) Inventors: Jürgen Frosien, Riemerling (DE); Ralf Degenhardt, Landsham (DE); Stefan Lanio, Erding (DE); Gerald Schönecker, Munich (DE)

(73) Assignee: ICT Integrated Circuit Testing Gesellschaft fur Halbleiternruftechnik mbH, Heimstetten (DE)

( * ) Notice: Subject to any disclaimer, the term of this patent is extended or adjusted under 35 U.S.C. 154(b) by 273 days.

(21) Appl. No.: 10/571,345

(22) PCT Filed: Sep. 2, 2004

(86) PCT No.: PCT/EP2004/009796

§ 371 (c)(1),
(2), (4) Date: Sep. 28, 2006

(87) PCT Pub. No.: WO2005/024889

PCT Pub. Date: Mar. 17, 2005

(65) Prior Publication Data

US 2007/0158561 A1    Jul. 12, 2007

(30) Foreign Application Priority Data

Sep. 11, 2003 (EP) ................... 03020710
Dec. 16, 2003 (EP) ................... 03028694

(51) Int. Cl.
*G21K 1/08* (2006.01)
*H01J 37/21* (2006.01)
*H01J 37/20* (2006.01)

(52) U.S. Cl. ............. 250/396 R; 250/310; 250/396 ML

(58) Field of Classification Search ............ 250/396 R, 250/396 ML, 310
See application file for complete search history.

(56) References Cited

U.S. PATENT DOCUMENTS

| 7,244,932 | B2* | 7/2007 | Nakasuji et al. ............. 250/306 |
| 7,335,894 | B2* | 2/2008 | Frosien et al. .......... 250/396 R |
| 2007/0164228 | A1* | 7/2007 | Frosien ................ 250/396 ML |
| 2007/0200069 | A1* | 8/2007 | Frosien et al. .......... 250/396 R |

* cited by examiner

*Primary Examiner*—Nikita Wells
(74) *Attorney, Agent, or Firm*—Patterson & Sheridan, LLP

(57) ABSTRACT

The present invention provides a charged particle beam device. The device comprises a first lens generating a crossover a second lens positioned after the crossover and an element acting in a focusing and dispersive manner in an x-z-plane with a center of the element having essentially same z-position as the crossover. Further, a multipole element, which acts in the x-z-plane and a y-z-plane is provided. A first charged particle selection element and a second charged particle selection element are used for selecting a portion of the charged particles. Thereby, e.g. the energy width of the charged particle beam can be reduced.

27 Claims, 10 Drawing Sheets

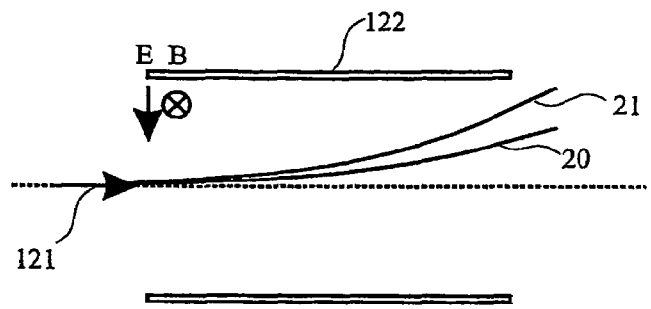
Fig. 12a
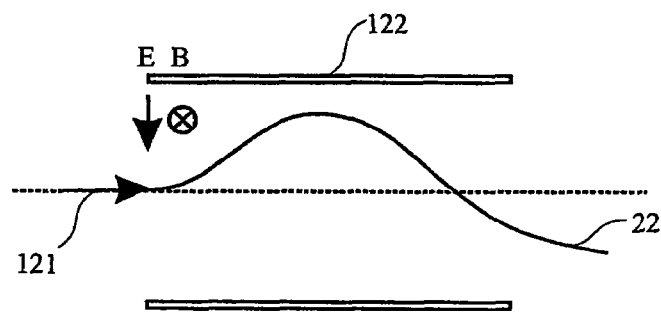
Fig. 12b
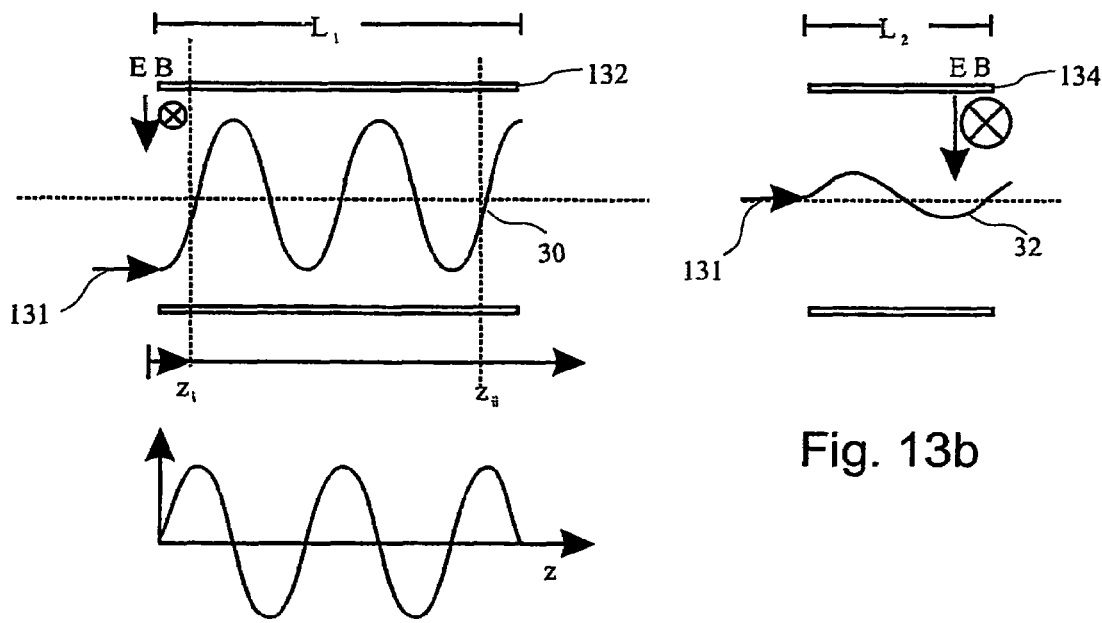
Fig. 13a
Fig. 13b

SINGLE STAGE CHARGED PARTICLE BEAM ENERGY WIDTH REDUCTION SYSTEM FOR CHARGED PARTICLE BEAM SYSTEM

CROSS-REFERENCE TO RELATED APPLICATIONS

This application claims foreign priority benefits under 35 U.S.C. §119 to co-pending European patent application numbers EP 03020710.4, filed Sept. 11, 2003, and EP03028694.2, filed Dec. 16, 2003. These related patent applications are herein incorporated by reference in their entireties.

FIELD OF THE INVENTION

The invention relates to charged particle beam devices for inspection system applications, testing system applications, lithography system applications and the like. It also relates to methods of operation thereof. Further, the present invention relates to charged particle selection systems. Specifically, the present invention relates to charged particle beam devices and methods of using a charged particle beam energy width reduction system.

BACKGROUND OF THE INVENTION

Charged particle beam apparatuses have many functions in a plurality of industrial fields, including, but not limited to, inspection of semiconductor devices during manufacturing, exposure systems for lithography, detecting devices and testing systems. Thus, there is a high demand for structuring and inspecting specimens within the micrometer and nanometer scale.

Micrometer and nanometer scale process control, inspection or structuring, is often done with charged particle beams, e.g. electron beams, which are generated and focused in charged particle beam devices, such as electron microscopes or electron beam pattern generators. Charged particle beams offer superior spatial resolution compared to, e.g. photon beams due to their short wavelengths.

However, in modern low voltage electron microscopes, aberrations limit the achievable resolution to approximately 3 nm for 1 keV electron energy. Especially for low energy application, it is therefore desirable to reduce chromatic aberrations. The diameter of the aberration disc of the chromatic aberration in the Gaussian image plane of an objective is proportional to the relative energy width ΔE/E of the charged particle beam.

The electrons in an electron beam column are not monochromatic because of the emission process and the Boersch effect, that is, the broadening of the energy distribution because of stochastic Coulomb interaction so that the relative energy width is increased. In view of the above, the energy width ΔE amounts to approximately 0.5 to 1 eV in dependence upon the beam current.

A further minimization of the chromatic aberration based on the focusing properties of, for example, the objective lens is difficult. For this reason, it is already known to utilize monochromators, in order to further increase the resolution. Thereby, the energy width ΔE of the electron beam, which is processed subsequently by the downstream electron-optical imaging system, can be reduced.

Wien filters are known as monochromators for charged particles wherein an electrostatic dipole field and a magnetic dipole field are superposed perpendicularly to each other.

As an example, patent publication U.S. Pat. No. 6,489,621 (Frosien et al.) shows a device for reducing the energy width of a particle beam with a $1^{st}$ and a $2^{nd}$ Wien filter for dispersing the particle beam depending on the energy of the particles, and an aperture for selecting the particles within a certain reduced energy width.

However, there is still a necessity for a system suitable for an increased dispersion of a charged particle beam energy width reduction system.

SUMMARY OF THE INVENTION

The present invention provides an improved charged particle system. Thereby, the resolution of the system is intended to be improved. According to aspects of the present invention, a charged particle beam device according to independent claim 1 and a method of using a charged particle beam velocity distribution width reduction system according to independent claim 29 are provided.

Further advantages, features, aspects and details of the invention are evident from the dependent claims, the description and the accompanying drawings.

According to one aspect of the present invention, a charged particle beam device is provided. The charged particle beam device comprises a first lens generating a crossover, a second lens positioned after the crossover and a Wien filter element acting in a focusing and dispersive manner in an x-z-plane. The Wien filter element is positioned regarding the z-position so that the crossover is located essentially in the center-plane of the Wien filter element. Further, the charged particle beam device comprises a multipole element, which acts in the x-z-plane and a y-z-plane. The multipole element is positioned regarding the z-position so that the crossover is located essentially in the center-plane of the multipole element. The charged particle beam device further comprises a first electron selection element being positioned in beam direction before the Wien filter element and a second electron selection element being positioned in beam direction behind the Wien filter element.

Thereby, the focusing effect of the combined electrostatic and magnetic fields can negate each other and the excitation of the electrostatic and magnetic fields can be increased. Thus, also the deflection angle of the charged particles increases with increasing excitation. The dispersion of this system is not limited in principal.

Within the present application, the term essentially is preferably understood as including a ±5%-tolerance of the length in z-direction of the multipole element.

Within the present application, instead of a Wien filter element, also other elements acting in a focusing and dispersive manner in one plane can be used.

Within this application the disclosed energy width reduction element is also denoted as a monochromator. The term monochromator in the present application is not to be understood as selecting a single energy of the charged particles, but as filtering the charged particle beam to obtain a desired energy width.

According to the above aspect, charged particles with different energies are separated due to the dispersion introduced. However, going into more detail, it can be found that a selection is conducted based on the velocity of the charged particles. The velocity is given by equation 1.

$$v = \mathrm{sqrt}(2E/m) \qquad (1)$$

Thereby, v is the velocity (non-relativistic), sqrt represents the square root, E is the energy of the charged particles, and m is the mass of the charged particles. Alternatively, equation (1) can be written as:

$$v = \text{sqrt}(2qU/m) \quad (2)$$

Thereby, q is the charge of a particle and U the acceleration potential. The above-mentioned aspect relates to an energy dependent selection for particles with a constant mass, as for example electrons.

Nevertheless, the apparatus according to one aspect of the present invention can also be used for mass spectrometry of charge particles. A variation of the velocity v results in a separation of different elements with different masses or different isotopes of one element. This variation is large enough to ignore the energy variation of e.g. 1 eV at an energy of e.g. 1 keV which corresponds to a relative energy width of 1 e-3.

In view of the above, the energy width reduction described can be generally applied to a velocity distribution width reduction. The velocity distribution width reduction is, according to equation 1, either an energy width reduction or a mass distribution width reduction. Since the mass distribution generally has discrete values, the mass distribution width reduction can also be considered a mass selection.

With respect to the mass selection, a further advantage of the present invention can be described. State of the art mass spectrometers making use of e.g. Wien filters have the problem that based on the focusing effect of the Wien filters, which results in an elliptical shaped beam after the mass selection. The focusing effect of the beam filter is compensated, or almost compensated for, within the present invention. Thus, the disadvantage of elliptical beams after mass selection can be avoided.

As described above, the velocity distribution width reduction can either be an energy width reduction or a mass selection. Consequently, regarding the aspects of the subject invention, a velocity distribution width reduction system can either be an energy width reduction system or a mass selection system. Further, a velocity dependent selection element can either be an energy dependent selection element or a mass dependent selection element.

According to an aspect systems can be provided, whereby the charged particles have the same mass; and the charged particle beam velocity distribution width reduction system is used as a charged particle beam energy width reduction system. According to another aspect, systems can be provided, whereby the charged particles have a different mass; and the charged particle beam velocity distribution width reduction system is used as a charged particle beam mass selection system.

In the following, for easier explanation, it is referred to as an energy width reduction. However, the described aspects, details, and embodiments can also be utilized for mass selection of charge particles. Thus, generally, the described aspects, details, and embodiments can be used for a velocity distribution width reduction.

According to another aspect the first charged particle selection element is a charged particle angle dependent selection element and the second charged particle selection element is a charged particle energy dependent selection element. Thus, the first charged particle generates a beam shape. After the shaped beam is deflected corresponding to the charged particle energy, the second charged particle selection element blocks charged particles which do not have the nominal energy or an allowed deviation therefrom.

According to a further aspect, the first charged particle selection element and the second charged particle selection element have a corresponding shape. That is, the second charged particle selection element has a shape that is adapted to the charged particle beam shape generated with the first charged particle beam selection element.

As the second charged particle selection element is not positioned at a crossover, it may also be considered as a charged particle energy dependent and angle dependent selection element.

According to another aspect, the length of the field region of the Wien filter element and the length of the field region of the multipole element are essentially similar. Thus, a compensation of the focusing properties of the Wien filter element can be realized for all z-position.

Within the present application, the beam direction corresponds to the z-axis. Unless otherwise noted, the term "length of a field (region)" or "length of a component" describes the dimension in z-direction.

According to another aspect, a charged particle beam energy width reduction system and a method of operating thereof is provided. Thereby, an excitation gl of more than 5 can be realized. Due to the continuous increase of the dispersion of the system without a limit based on the focusing effect, the increased excitation can be utilized for an increased dispersion and thereby an improved system.

According to another aspect the components of the energy width reduction system are arranged and/or operated so that a relationship increasing strictly, typically linearly, between the normalized dispersion $x_k/l$ of the system and the excitation gl is realized. According to an even further aspect this strict increase is realized with discrete values.

According to another aspect, the first lens is a magnification lens and the second lens is a demagnification lens. However, the present invention is not limited thereto. Further, according to still another aspect, the first and the second lenses are immersion lenses. The first lens is used to decelerate the charged particle beam for passing through the Wien filter element, whereas the second lens accelerates the charged particle beam thereafter. Thereby, on the one hand, the charged particles are selected while the charged particle beam is magnified. On the other hand, the deflection by the dispersive Wien filter is increased. Both aspects can be used to simplify the charged particle beam energy width reduction.

According to another aspect, the multipole element and the Wien filter element are provided by a single multipole component and preferably the multipole component can be used to generate further fields for e.g. beam alignment, aberration correction or the like. Thereby, the number of components that have to be adjusted with respect to each other is decreased.

According to another aspect, the multipole element comprises either a magnetic quadrupole element and/or an electrostatic quadrupole element.

According to another aspect, a method of using a charged particle beam energy width reduction system is provided. The method comprises the steps of: providing a Wien filter element, a quadrupole element, a first charged particle selection element and a second charged particle selection element. Further, it comprises: selecting charged particles with the first charged particle selection element, exciting the Wien filter element and the quadrupole element, adjusting the field strength of the Wien filter element and the quadrupole element so that there is no focusing effect in the x-z-plane and that there is virtually no focusing effect in a y-z-plane; and selecting charged particles with the second charged particle selection element.

Due to the compensation of the focusing effect in the x-z-plane, the excitation of the Wien filter element can be increased. Thereby, the charged particle beam energy width can be decreased.

According to another aspect, the field strengths of the Wien filter element and the quadrupole element are adjusted to a value selected from a plurality of discrete values. Thereby, an imaging in the y-z-plane having virtually no focusing effect is realized.

The term having virtually no focusing effect means that after the particle optical system, the particle beam appears to originate from the x-y-center-plane of the Wien filter element.

According to another aspect, the Wien filter element and the quadrupole element is illuminated so that a crossover is generated with a z-position that is essentially similar to the z-position of the respective x-y-center-planes of the field regions of the Wien filter element and the quadrupole element.

Yet according to another aspect, the charged particle beam is aligned within the charged particle beam energy width reduction system. Thereby, the charged particle energies, which are to be selected, can be chosen.

The invention is also directed to apparatus for carrying out the disclosed methods, including apparatus parts for performing each of the described method steps. These method steps may be performed by way of hardware components, a computer programmed by appropriate software, by any combination of the two, or in any other manner. Furthermore, the invention is also directed to methods by which the described apparatus operates or is manufactured. It includes method steps for carrying out every function of the apparatus.

BRIEF DESCRIPTION OF THE DRAWINGS

Some of the above indicated and other more detailed aspects of the invention, will be described in the following description and partially illustrated with reference to the figures. Therein:

FIGS. 12a to 13b show schematic side views of Wien filters and excitation conditions.

DETAILED DESCRIPTION OF THE DRAWINGS

Figure 1:
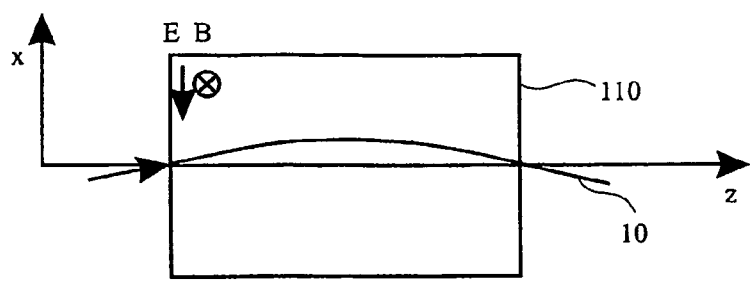
FIG. 1 shows a schematic side view in the x-z-plane of a Wien filter and an exemplary beam path of an electron beam entering the Wien filter.

Without limiting the scope of protection of the present application, in the following the charged particle beam device or components thereof will exemplarily be referred to as an electron beam device or components thereof. Thereby, the electron beam might especially be utilized for inspection or lithography. The present invention can still be applied for apparatuses and components using other sources of charged particles and/or other secondary and/or backscattered charged particles to obtain a specimen image.

Those skilled in the art would also appreciate that all discussions herein related to e.g. an x-z- or an y-z-plane are to be understood that the planes are essentially perpendicular to each other. Even though theoretical discussions in this application refer to coordinates in a mathematical sense, the respective components can practically be positioned with respect to each other so that the x-z- and y-z-plane enclose an angle of about 80° to 100°, preferably 87° to 93°, more preferably of about 89° to 91°.

Further, without limiting the scope of protection of the present application, in the following, the charged particle beams will be referred to as primary charged particle beams. The present invention might still be used for secondary and/or backscattered charged particles. Thereby, for example, the energy distribution of charged particles in an imaging optic can be controlled.

Within the following description of the drawings the same reference numbers refer to the same components. Generally, only the differences with respect to the individual embodiments are described.

With reference to FIGS. 12 and 13, some principles of the Wien filter will now be described. FIG. 12a shows a Wien filter element 122 and its influence on a charged particle 121. The dipole Wien filter comprises an electrostatic field E and the magnetic field B. The fields are perpendicular with respect to each other. The charged particle, which is indicated by arrow 121, has a non-nominal energy. Only charged particles with the nominal energy would be allowed to pass straight through the Wien filter. Thus, the non-Wien nominal energy charged particle 121 is deflected from the optical axis. This results in a charged particle beam 20.

A diagram like the one shown in FIG. 12a can be found in many textbooks. In practice, it is relevant to further increase the excitation of the Wien filter. An example therefore is shown in FIGS. 12a and 12b. Starting to increase the excitation, the excitation leads to an increased deflection angle, as indicated by charged particle beam 21. However, if the excitation of Wien filter 122 is further increased the charged particle beam reaches a limiting deflection angle. A further increase diminishes the deflection angle (see FIG. 12b). The charge particles are deflected towards the optical axis. Thus, even though the excitation is increased, the deflection angle is not increased beyond a certain limit. Yet, this deflection angle is necessary for the energy dependent charged particle selection.

This might be better understood with reference to FIG. 13a FIG. 13a shows a Wien filter 132 having a length $L_1$ along the optical axis (z-axis). An incoming charged particle 131 is imaged due to the electrostatic field and magnetic field. The Wien filter has, additionally to its dispersive properties, imaging properties. The diagram below shows the deflection angle versus the z-position. For position $z_i$ and position $z_{ii}$ the angles are approximately similar. Thus, not the entire excitation could be used to have an increased separation between charged particles of different energy.

The term excitation might be better understood when comparing FIG. 13a and 13b. The Wien filter of FIG. 13b has the shorter length $L_2$. However, the beam path 32 is comparable to the beam path 30. This is realized by having higher field strengths within Wien filter 134, which is indicated by the larger field symbols. The excitation can be considered to be the product from the length of the Wien filter and the field strengths.

Figure 2:
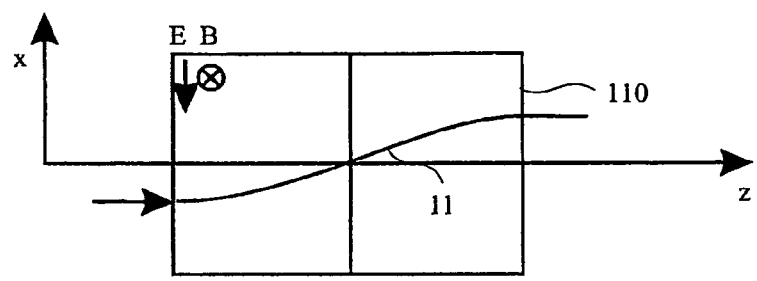
FIG. 2 shows a schematic side view in the x-z-plane of a Wien filter and another exemplary beam path of an electron beam entering the Wien filter.

FIG. 1 shows a view in the x-z-plane of the Wien filter 110. A charged particle, for example an electron, which enters the Wien filter 110 under an angle, follows beam path 10. The same system is shown in FIG. 2. A different electron entering the Wien filter 110 parallel to the optical axis with an offset thereto, follows e.g. beam path 11. Both of the above described beam paths 10 and 11 are generated due to the focusing action of the Wien filter 110 in the x-z-plane. As described above, this focusing action in the x-z-plane results in an upper limit for the deflection angle in the case of an increasing excitation.

Figure 3:
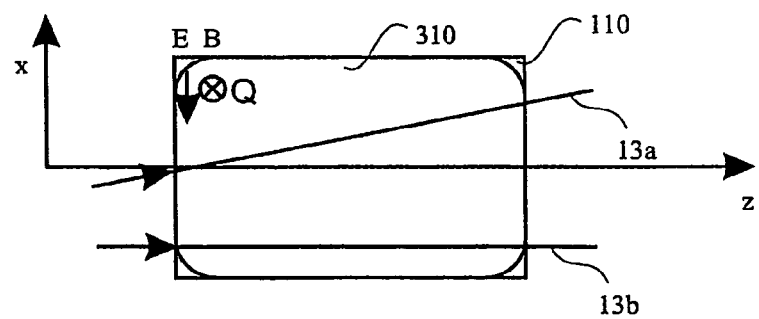
FIG. 3 shows a schematic side view in the x-z-plane of a Wien filter element and a quadrupole element and two exemplary beam paths of electron beams entering the system.

FIG. 3 shows a system, wherein the field of the Wien filter is overlaid with the field of a quadrupole element 310. The quadrupole element is arranged to have a defocusing effect in the x-z-plane. The excitation of the quadrupole element 310 is chosen so that the defocusing effect thereof and the focusing effect of the Wien filter 110 negate each other. Thus, electrons entering the optical system 110/310 do not experience any focusing action in the x-z-plane. As shown in FIG. 3 the particles pass straight through the system as indicated by beam paths 13a and 13b.

Figure 4:
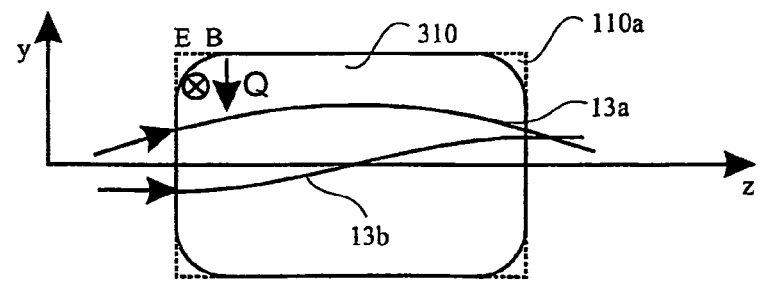
FIG. 4 shows a schematic side view in the y-z-plane of which corresponds to FIG. 3.

The effect of the combined Wien filter-quadrupole element optical system in the y-z-plane is explained with reference to FIG. 4. Wien filter 110a is drawn with dotted lines. The dotted lines indicate that the dipole Wien filter does not have any effect on the electrons in the y-z-plane. Consequently, the electrons, in the y-z-plane, are only influenced by the quadrupole element. The quadrupole element 310, which has a defocusing effect in the x-z-plane, has a focusing effect in the y-z-plane. Exemplary beam paths 13a and 13b can be seen in FIG. 4.

As described above, the combination of the Wien filter 110 and the quadrupole 310 and can be arranged so that there is no resulting focusing effect in the x-z-plane. Thus, the excitation and can be further increased without having an imaging scheme has e.g. shown in FIG. 13a. Nevertheless, the Wien filter element 110 introduces a dispersion for electrons with a non-nominal energy. Thus, the excitation can be increased far beyond the limit that is given by the focusing effect of the Wien filter (see FIGS. 12a to 13b).

Figure 5A:
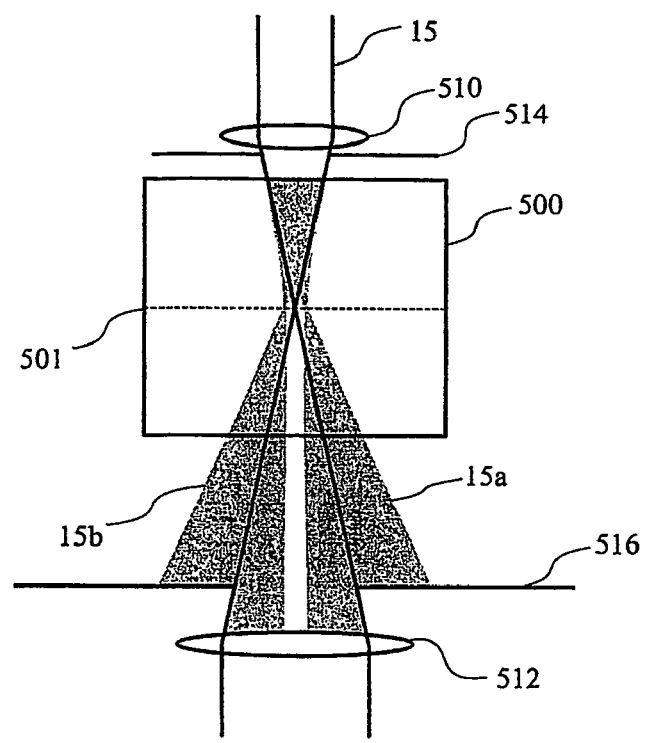
FIGS. 5a and 5b show schematic side views in the x-z-plane and in the y-z-plane, respectively, of an embodiment according to the present invention.
Figure 5B:
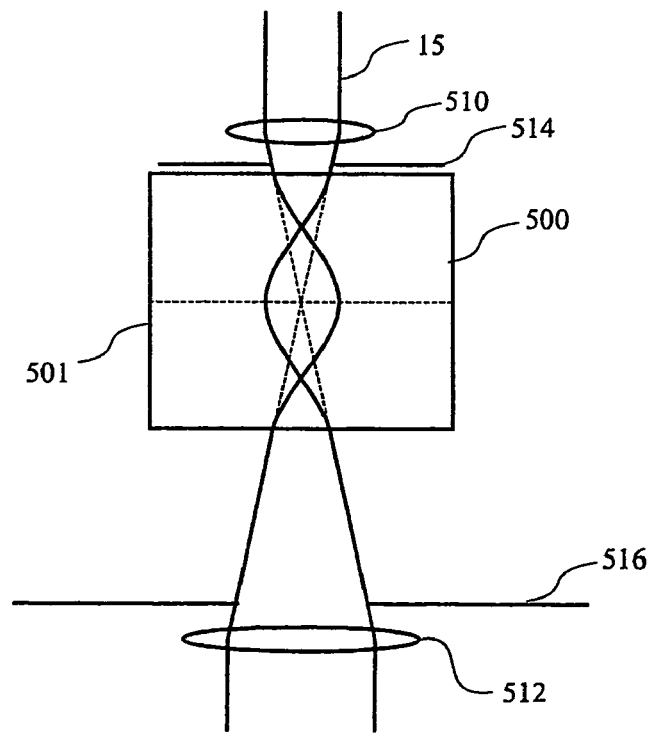

An embodiment utilizing the above-described effect will now be described with reference to FIGS. 5a and 5b. FIG. 5a shows a single stage electron energy width reduction system in the x-z-plane, whereas FIG. 5b shows the same system in the y-z-plane. The system comprises a first lens 510, which focuses the electron beam 15. The first lens may be a de-magnifying lens. However, without being limited thereto, it is more typical to a have a magnifying lens as the first lens. An electron selection means 514 blocks a portion of the electron beam. Thereby, an electron beam with the defined shape is generated. This beam shaping aperture means 514 may be considered an electron angle dependent selection element, since the angular spread of the electron beam is limited.

The shaped electron beam enters a combined Wien filter-quadrupole element system 500. For imaging reasons system 500 is positioned so that the center 501 of the system is essentially positioned at the crossover of electron beam 15. The Wien filter-quadrupole element system 500 does not have any imaging effect on the electrons in x-direction. Therefore, electrons with the nominal energy $E_n$ pass undeflected through the system. However, electrons with an energy deviating from the nominal energy $E_n$ are influenced by the dispersion introduced by the Wien filter. Depending on whether the energy of these electrons is below or above the nominal energy $E_n$, these electrons are deflected according to beams 15a or 15b. Below the optical system 500 there is a second electron selection means 516. The aperture of this selection means is formed so that electrons with the nominal energy or electrons with an allowed energy deviation can pass through the electron selection means and are not blocked. Portions of the electrons with an energy deviating from the nominal energy $E_n$ (see 15a, 15b) are blocked by the electron selection means. The aperture means 516 located behind optical system 500 can be considered an electron energy dependent selection means because of the capability to block electrons which energy deviates from $E_n$. Electrons, which pass through the aperture of the electron energy dependent selection means 516, are imaged by lens 512.

The beam path through the optical system 500 will now be described in the y-z-plane. The first lens 510, the first electron selection element 514, the combined Wien filter-quadrupole element system 500, the second electron selection element 516 and the second lens 512 have already been described with respect to FIG. 5a. Different from FIG. 5a, the view in the y-z-plane (see FIG. 5b) images electron beam 15 due to the focusing action of the quadrupole element in y-direction. However, there exist a plurality of defined excitation levels, imaging the electron beam 15 in the y-z-plane so that there is virtually no focusing effect.

The electron beam appears to originate from the x-y-center-plane of the system 500. The virtual origin of the electron beam is the crossover, which would be generated by lens 510 if no fields would be present in system 500.

Figure 6A:
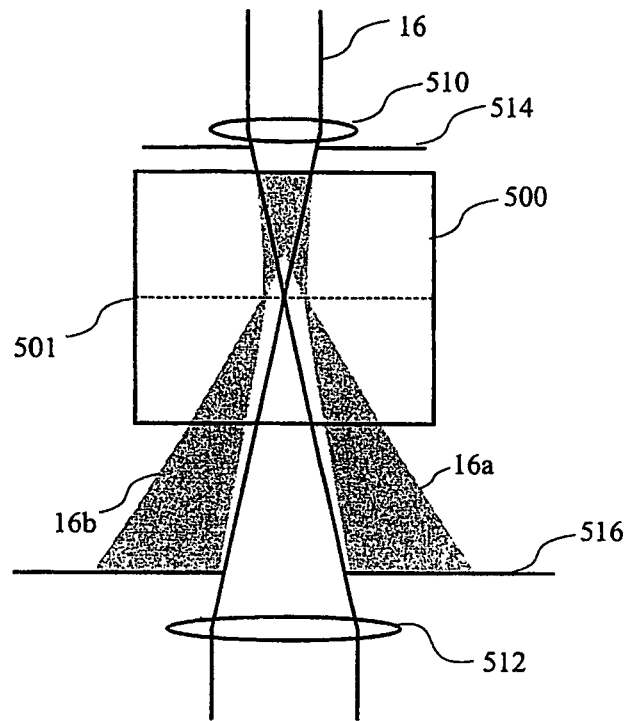
FIGS. 6a and 6b show schematic side views in the x-z-plane and in the y-z-plane, respectively, of an embodiment.
Figure 6B:
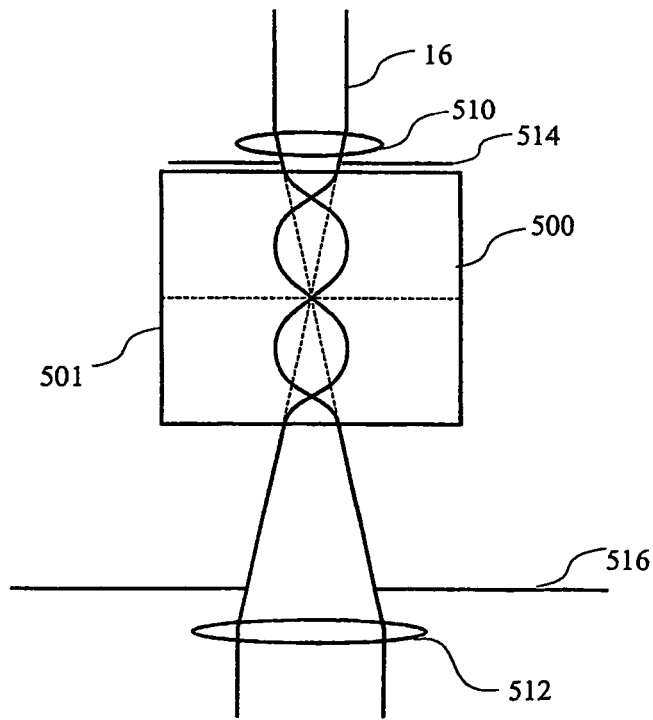

Another example for such a discrete excitation level is shown in FIG. 6b. The quadrupole element is excited so that in the y-z-plane there are three crossovers. Comparing FIG. 5b and FIG. 6b, the principal of how to excite the quadrupole element can be understood. The discrete excitation levels are defined so that the entire imaging in the y-z-plane appears to have no influence. These discrete values define the possible excitations of the quadrupole element. Since in the x-z-plane the focusing effect of the Wien filter and the quadrupole element should be chosen to negate each other, and since the excitation of the quadrupole element has to be chosen to be one of the discrete values, the Wien filter excitation has to be adapted to the quadrupole excitation. FIG. 6a shows the x-z-view corresponding to FIG. 6b. The increased quadrupole excitation of FIG. 6b as compared to FIG. 5b, requires also an increased excitation of the Wien filter. The electrons with the nominal energy $E_n$, which follow beam path 16, are not deflected in x-direction. However, in FIG. 6a, due to the increased excitation of the Wien filter, electrons with an energy deviating from the nominal energy are deflected more as compared to FIG. 5a This can be seen by comparing beam paths 16a, 16b with beam paths 15a, 15b, respectively.

Figure 14A:
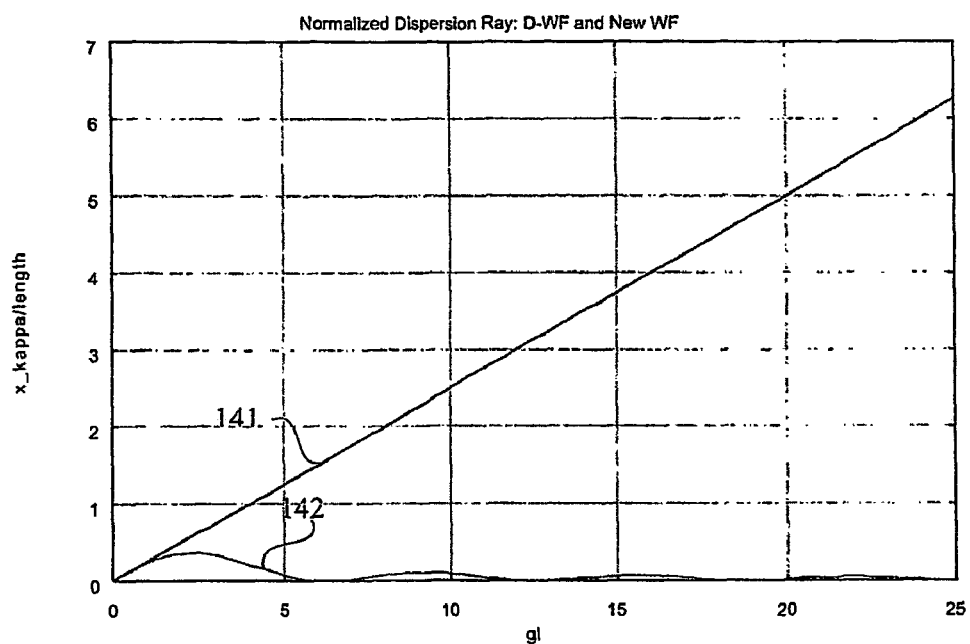
FIGS. 14a to 14b show calculated dispersion results comparing prior art systems to the present invention.
Figure 14B:
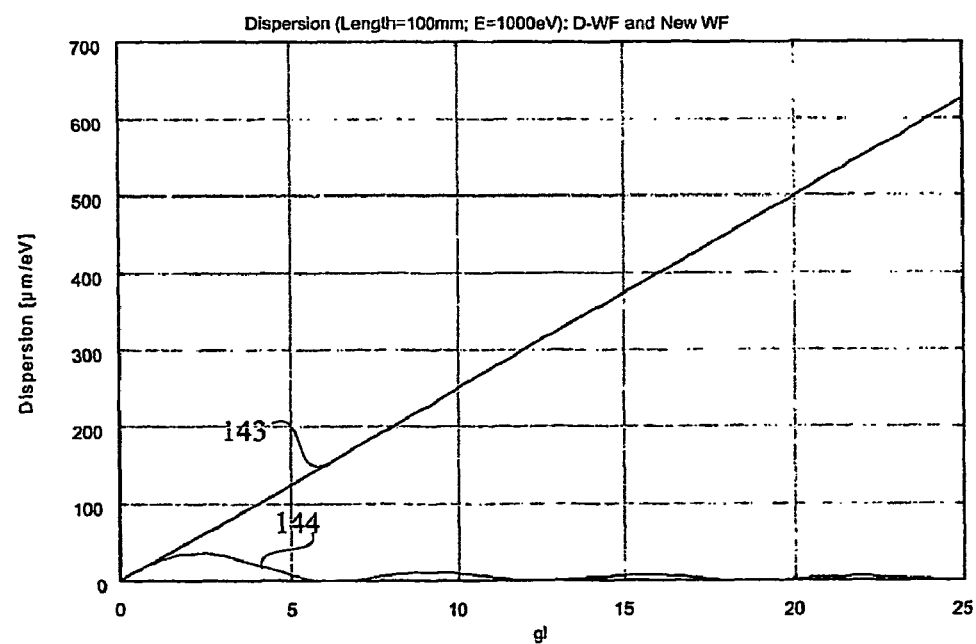

The present invention might also be understood with respect to FIGS. 14a and 14b. FIG. 14a shows a normalized dispersion $x_K/l$ for a prior art system and the present invention. The normalization factor 1 is the length of the dispersive region. The considered prior art system is a dipole Wien filter in general. As can be seen from curve 142, the normalized dispersion of a prior art system cannot exceed a value above 0.36. It can be calculated that generally for all prior art systems with dipole Wien filters, the normalized dispersion $X_K/l$ has a principal maximum of about 0.4.

Since the present energy width reduction system does not act in a focusing manner in x-direction, the normalized dispersion further increases while the excitation gl is further increased (see curve 141). The excitation is given by the product of the dipole-potential, the length of the excited region divided by two times the charged particle potential.

From the generally valid normalized dispersion, special examples can be calculated. An example is shown in FIG. 14b. Thereby, the prior art system, that is a dipole Wien filter with a length of 100 mm and a beam energy of 1 keV, has a maximum dispersion of about 36 µm/eV at an excitation gl of about 2.3 (see curve 144). Using the same length, the same dipole potential and the same electron energy, the present invention enables a dispersion which is about a factor 1.6 larger, namely 58 µm/eV. For higher excitations gl the possible improvement of the present invention is even higher (see curve 143).

FIGS. 7a to 7e show different examples for embodiments of the electron selection elements 514/516. Thereby, the first and the second electron selection elements are drawn to be identical. However, the present invention is not limited thereto. It is preferred to have at least the sizes of the openings 706, 705 or 704 differ between the electron angle dependent selection element and the electron energy dependent selection element.

Without limiting the invention thereto, according to a typical embodiment, the first electron selection element and the second electron selection element have round apertures.

It is further possible, without limiting the invention thereto, that the first electron selection element has a round aperture, whereas the second electron selection element has a slit aperture. Alternatively, the first electron selection element has a round aperture, whereas the second electron selection element is provided by a selection edge, that is a knife edge, according to FIGS. 7d or 7e.

Further, for example, a possible magnification of the electron beam can be taken into account. In the case where the electron beam shape is deformed due to aberrations or the like, it is further possible that the shape of the opening of the second electron selection element is adapted to the deformation.

Figure 7A:
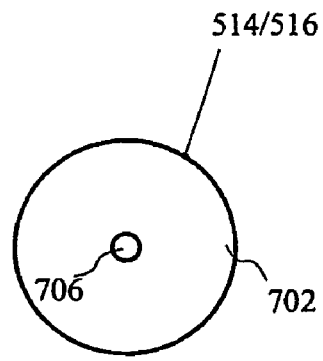
FIGS. 7a to 7e show schematic views of embodiments of electron selection elements.

FIG. 7a shows a disc element 703 with a round aperture 706. The beam is shaped by blocking the portion of the beam which impinges on the disc element 702. With respect to the second electron selection element, the electrons which are deflected energy-dependently in x-direction are partly blocked by the disc element 702 of the second energy dependent selection element. Thereby, the energy width of the electron beam can be reduced.

Figure 7B:
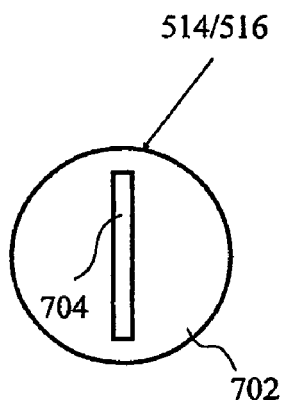

FIG. 7b shows a round disc element 702 with a slit aperture 704. Within the monochromator, the slit would extend in y-direction. Thereby, electrons with the nominal energy could pass through the center of the slit independent of the displacement from the optical axis in y-direction. Non-nominal energy electrons would be deflected in x-direction and would thus be blocked by the disc element 702.

The slit aperture may for example be used to avoid contaminated regions of the slit. In the case where a region of the slit is contaminated, the electron selection element can be displaced in y-direction. Thereby, a different region of the slit aperture 704 may be used, which is not contaminated.

Figure 7C:
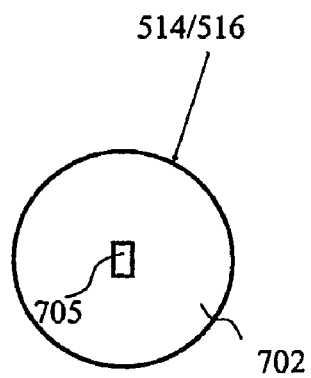

FIG. 7c shows an electron selection element 514/516 with a disc element 702 and a short slit 705. Slit 705 has a smaller extension in y-direction. Therefore, electrons which pass through the slit need to have less deviation from the optical axis in direction. In view of the above, electron selection element 514/516 of FIG. 7c can be considered an electron energy depending and angle depending selection element. Aperture means 514/516 select the electrons energy depending in x-direction an angle depending in y-direction.

Figure 7D:
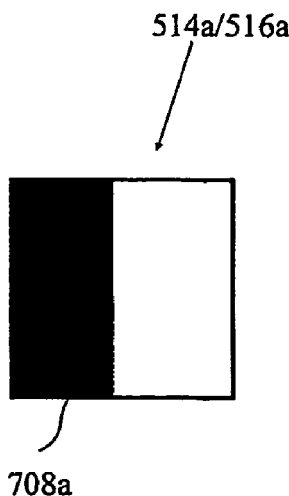
Figure 7E:
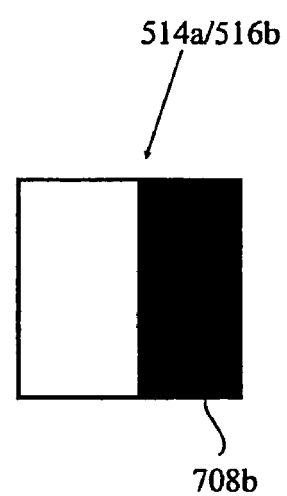

Further embodiments are described with respect to FIGS. 7d and 7e. All above described embodiments had at least an electron selection in positive x-direction and in negative x-direction. However, it is also possible to provide an electron selection means, a selection edge, that only blocks electrons deviating from the nominal beam path in one of either positive or negative x-direction. Thereby, only one edge limiting the electron beam is provided. Element 514a/516a and 514b/516b are two examples. Each of which has a solid part 708a or 708b, respectively. All electrons passing on the right side of solid part 708a are not blocked. All electrons passing on the left side of solid part 708b are not blocked.

The components of FIGS. 7d and 7e can be used for different embodiments. Thereby, the components can be used separately or they can be combined. A first embodiment making use of one of the components of FIG. 7d or 7e will now be described. Depending on the side of the electron energy spectrum that should be blocked, either electron selecting element 514/516a or 516b can be used. Nevertheless, an electron selection edge could only block a low-energy or a high-energy part of the electron energy spectrum. This might however be sufficient as will be described in the following.

As described with respect to the state of art, it is for example desirable to reduce the energy width of the primary electron beam. The energy width is thereby mainly influenced by the emitter characteristic. Consequently, the desired energy selection depends on the emitter characteristic. Some emitters, like Schottky emitters or cold-field emitters, have an asymmetric emitting spectrum. That is, the energy spectrum of the emitted electrons has a steep flank on one side of the emission peak, whereas on the other side of the peak, the spectrum has a tail-like shape. The tail-like shape of one side of the emission spectrum dominates the energy width ΔE. Thus, in the case where the tail of the spectrum is blocked, the energy width ΔE can be sufficiently decreased. In view of the above, it can be sufficient to only use an edge to select electrons.

A second embodiment making use of both components of FIG. 7d and 7e will now be described. The two electron selection elements are positioned to be—in z-direction—neighboring elements. Thus, each element is used to select electrons depending on the deviation from nominal energy. By combining the two elements a slit comparable to slit 704 is formed. However, providing two separate components might be used because of easier maintenance, reduced tendency to contamination, or the like.

A third embodiment making use of both components of FIG. 7d and 7e will now be described. The second embodiment described above can be diversified as follows. In the case, where two separate electron selection elements 514/516a and 514/516b are used, each element can be adjusted independently of each other.

Describing the previously mentioned electron energy dependent selection elements no reference was made to any adjustment of the energy width ΔE. The system described with respect to FIGS. 5a to 6b provides the opportunity to adjust the electron energy width ΔE by adjusting the width of the electron selection element 416 in x-direction. All embodiments described above might be equipped with aperture width variation means. Alternatively, electron selection elements, each having fixed aperture width, might be exchangeable in order to select the electron energy width.

According to further embodiments (not shown) the electron selection elements might alternatively or additionally be movable.

The currently described embodiment referring to FIGS. 7d and 7e provides the opportunity to more easily adjust the edges of the electron selection elements and, further still, to easily adjust the selection elements independently of each other.

Figure 8A:
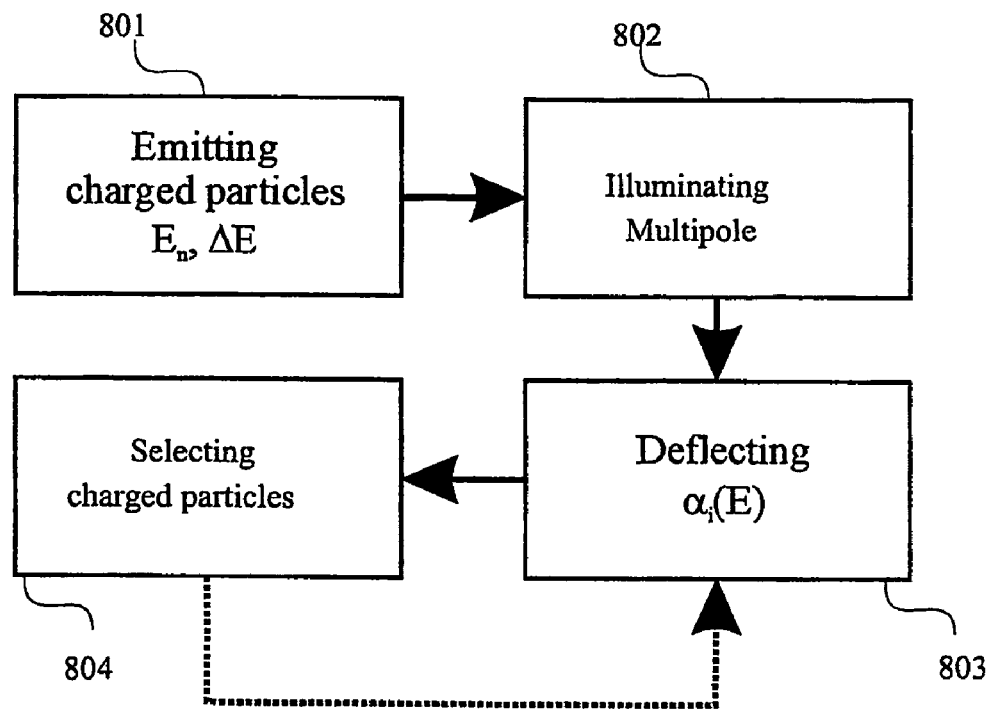
FIG. 8a shows a method of reducing the charged particle beam energy width.

FIG. 8a shows a flowchart of the respective method. Method step 801 refers to the generation of charged particles. The charged particles are emitted and accelerated to the nominal energy $E_n$. Thereby, the electron beam has an energy width of ΔE. The electrons pass through the optical column, whereby the multipole component that is a part of the electron beam energy width reduction system is illuminated with a lens (see step 802). Within the multipole component, according to method step 803, the electrons are deflected. The deflection angle is a function of the energy of the electrons α(E). The energy dependent deflection is conducted in x-direction. Electrons with a nominal energy $E_n$ are not focused in the x-z-plane and are virtually not focused in the y-z-plane. The electrons, which have been deflected depending on their energy, are selected by an electron energy dependent selection component (see step 804).

As indicated by the dotted arrow in FIG. 8a, the above described method may be further expanded. After a first deflection α(E) and a corresponding charged particle selection, which corresponds to a first measurement mode, the deflection can be modified to $α_i(E)$. The modified deflection can be used to control the charged particle beam current or the energy width (resolution respectively). Thus, the device can be operated in a second measurement mode or even further measurement modes due to modification of the charged particle deflection. Thereby, the charged particle selection elements do not need to be adjusted mechanically.

Figure 8B:
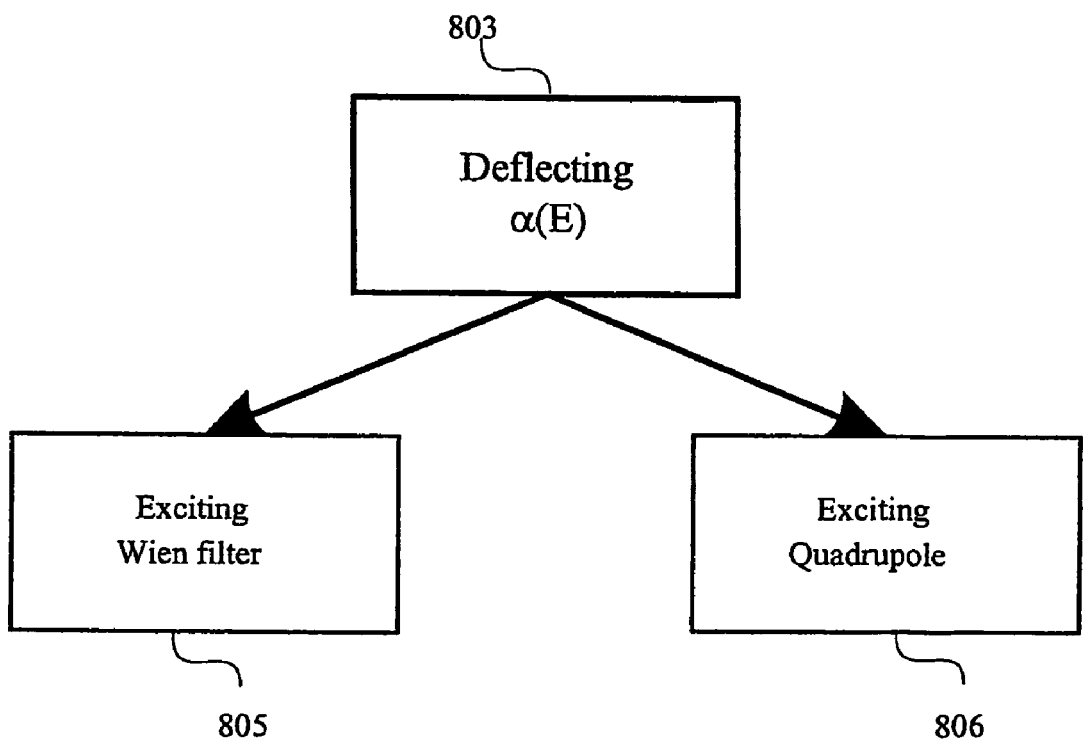
FIG. 8b shows a method of operating components of a charged particle beam energy width reduction system to generate dispersion.

The method of operating the multipole in order to realize that deflection is described in FIG. 8b. Method step 803 comprises essentially the following two steps. On the one hand, according to method step 805, the Wien filter element is excited. On the other hand, according to method step 806, the quadrupole element is excited so that in x-direction the focusing effect of the Wien filter element is cancelled out and that in y-direction there is virtually no focusing effect. Realizing virtually no focusing effect can be achieved by choosing one of a plurality of discrete excitation values.

The above methods can be used to further increase the excitation and, thereby, the dispersion as compared to a Wien filter element with Gaussian focusing properties.

Figure 9A:
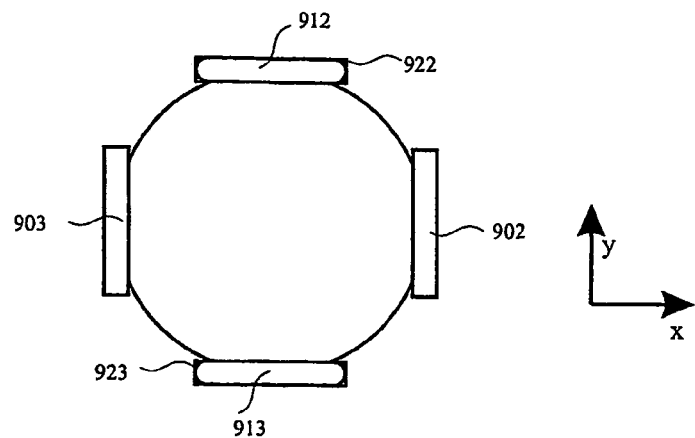
FIGS. 9a to 9c show schematic views in the direction of the z-axis of Wien filter elements and quadrupole elements.
Figure 9B:
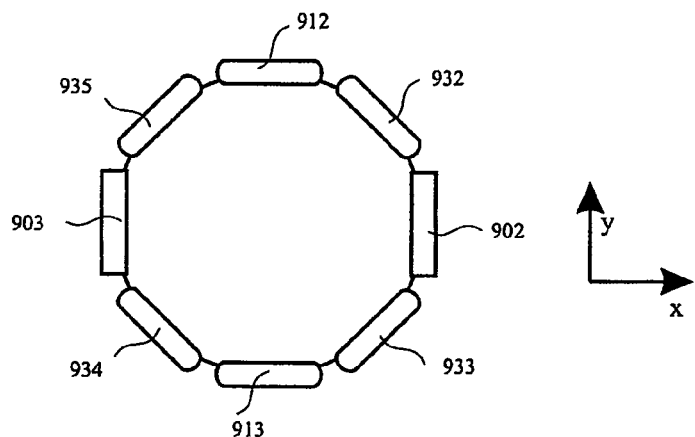
Figure 9C:
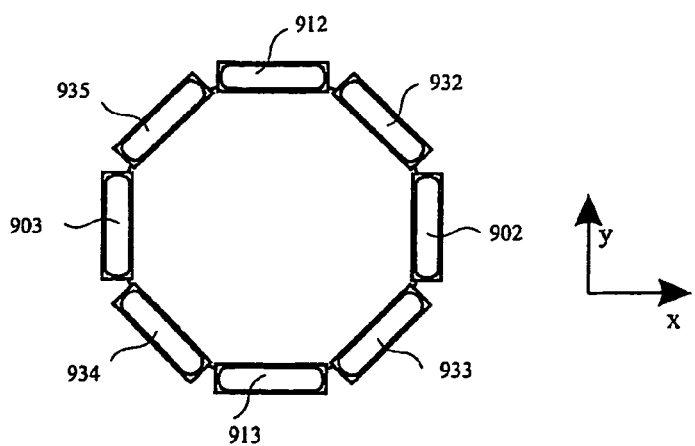

FIGS. 9a to 9c show different embodiments of the combination of the Wien filter elements and the quadrupole element. The views are in direction of the z-axis. In FIG. 9a there are electrostatic poles 902 and 903. These poles are used to generate an electrostatic field in x-direction. Magnetic poles 912 and 913, which are generally excited by coils, are used to generate a magnetic field in y-direction. The poles 902, 903, 912 and 913 form a dipole Wien filter element.

Further, electrostatic poles 922 and 923 are provided. These electrostatic poles 922 and 923 form together with electrostatic poles 902 and 903 an electrostatic quadrupole, which can be used to compensate for the focusing in x-direction of the Wien filter. The Wien filter element and the quadrupole element share poles. Thus, these two elements are provided as one component. Thereby, an even more simplified configuration and adjustment can be realized.

In an alternative embodiment (not shown) the electrostatic poles of the Wien filter element and the electrostatic poles of the electrostatic quadrupole element can be separated. A possible separation of the poles of the Wien filter element and the quadrupole element can be more easily understood with reference to FIG. 9b.

FIG. 9b shows an embodiment with a dipole Wien filter element (902, 903, 912, 913) and a magnetic quadrupole 932 to 935. In order to generate a defocusing in x-direction and a focusing in y-direction with the magnetic quadrupole element, the poles of the magnetic quadrupole are rotated by 45° as compared to the poles of the Wien filter element. In the case of FIG. 9b, two possibilities can be realized; namely to provide one multipole including the Wien filter element and the quadrupole element or to provide two components.

FIG. 9c shows an illustration of an embodiment for a combined electrostatic magnetic multipole. Thereby, two electrostatic and two magnetic poles form a dipole Wien filter. Further, an electrostatic and/or magnetic quadrupole field can be generated. Additionally, higher order multipole fields can be generated in order to compensate for aberrations introduced during any imaging of a charged particle beam on a specimen. Additional dipole fields may be generated in order to align the beam.

For example, it is possible to use the additional multipoles to align the charged particle beam by introducing an additional dipole field. As described with respect to FIGS. 5a and 6a, the position of the electrons in x-direction decides whether or not electrons are blocked at electron selection element 516. Thus, an alignment of the electron beam with an additional dipole element can be used to select the energies that are blocked by the electron energy width reduction system.

Embodiments of electron beam columns utilizing an electron beam energy width reduction system are described in FIGS. 10a to 11b. All of these embodiments show an electron beam column 1 wherein an electron beam is emitted by emitter 6. The column comprises a housing 2 and the specimen chamber 3, both of which can be evacuated. The electron beam traveling substantially along the optical axis 5 impinges on specimen 4.

Within FIG. 10a, the emitted electrons that are accelerated by anode lens 7 and form a first crossover below the anode lens. Illumination lens 101 illuminates the multipole component 100. A portion of the electron beam is blocked by electron selection element 103 before entering the multipole component. Thereby, a defined beam shape is generated. Lens 101 illuminates the multipole component 100 such that the generated crossover is located in the center of the multipole component. Multipole component 100 does not have any focusing effect in the x-z-plane and has virtually no focusing effect in the y-z-plane. Therefore, the excitation can be increased to realize a desired dispersion. The electrons, which are deflected due to the dispersion can be selected by electron energy dependent selection element 104. Objective lens 102 is used to focus the electron beam on the specimen. Independent of specific embodiments, the multipole component 100 comprises a dipole Wien filter and an electrostatic quadrupole, a dipole Wien filter and a magnetic quadrupole, or any other higher order multipole component that is capable of at least generating a dipole Wien filter field and the quadrupole field. Further independent of specific embodiments, separate components for generating the Wien filter fields and the quadrupole field can be provided or, alternatively, one component for generating the Wien filter fields and the quadrupole field can be provided.

Figure 10A:
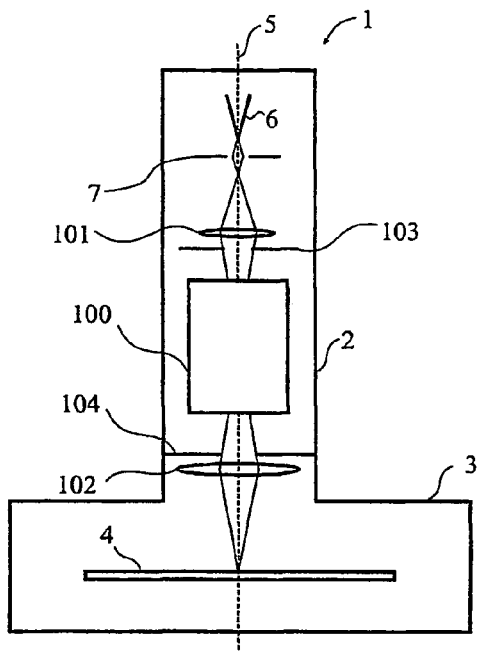
FIGS. 10a to 10b show schematic side views of exemplary embodiments of charged particle beam columns with charged particle beam energy reduction systems according to the present invention.
Figure 10B:
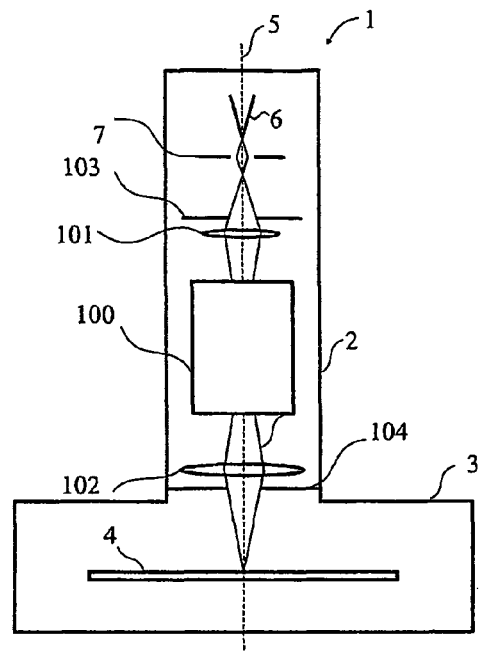

Contrary to the embodiment of FIG. 10a, the embodiment of FIG. 10b comprises an electron angle dependent selection element 103 that is positioned above the illumination lens 101. FIG. 10b further shows an electron energy dependent selection element 104 that is positioned below the objective lens 102.

However, according to a further embodiment (not shown) it is also possible to have the electron selection element 103, which acts like an aperture, above illumination lens 101 and to have electron energy dependent selection element 104 above objective lens 102.

Figure 11A:
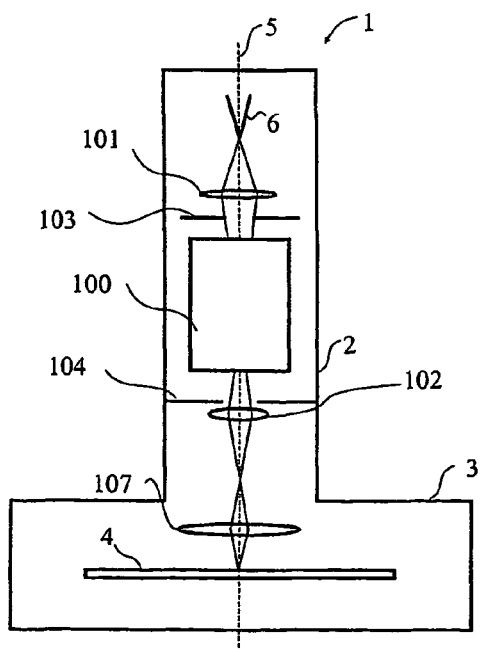
FIGS. 11a to 11b show schematic side views of exemplary embodiments of charged particle beam columns with charged particle beam energy reduction systems according to the present invention.
Figure 11B:
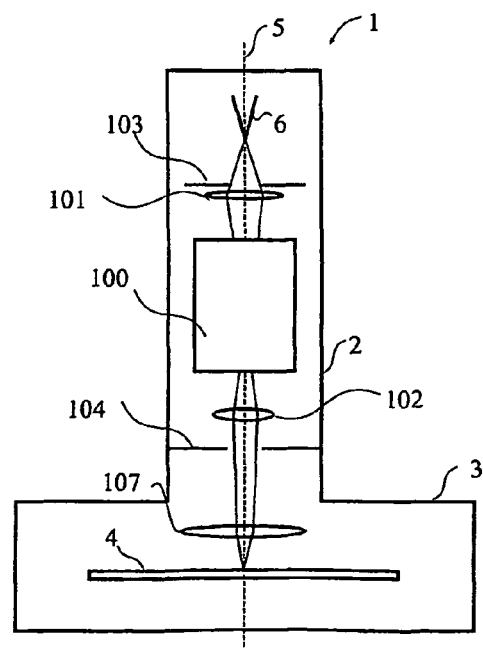

The embodiments shown in FIGS. 11a and 11b have a first magnifying illumination lens 101 above the multipole element 100, have second demagnifying lens 102, and have an objective lens 107.

FIG. 11a shows electron selection element 103 and 104 which are directly neighboring the multipole element 100. The electron selection element 103, which is positioned above, is an electron angle dependent selection element. The electron selection element 104, which is positioned below, is an electron energy dependent selection element.

Within FIG. 11b, the first electron selection element 103 is positioned above the first lens 101 and the second electron selection element 104 is positioned below second lens 102. Again, according to further embodiments (not shown), both of the electron selection elements can be positioned above the respective lenses or, alternatively, below the respective lenses.

The embodiments of FIGS. 10a, 10b, 11a and 11b did not specify the first and the second electron selection element in detail. All embodiments and aspects that have been described with respect to FIGS. 7a to 7e can be used to select the electrons either energy-dependently or angle-dependently.

As can be seen from the above description referring to FIGS. 10a to 11b and the other embodiments described in the present application, the energy width reduction system is a straight vision system. Thereby, the optical axis and the z-axis coincide. The charged particle beam energy width reduction systems disclosed within this application are preferably, without limiting the invention thereto, straight vision systems. That is, the beam entering and leaving the system share a common straight optical axis. Nevertheless, the system may also be a non-straight vision system.

An example of such a system might be the following. In the presence of e.g. ionized molecules, which are accelerated in direction of the emitter, these ions could damage the emitter on impingement thereon. Utilizing a non-straight vision system, the ions would not impinge on the emitter because a possible beam curvature differs from e.g. electrons to ions. Such a system is e.g. described in FIG. 11c.

Figure 11C:
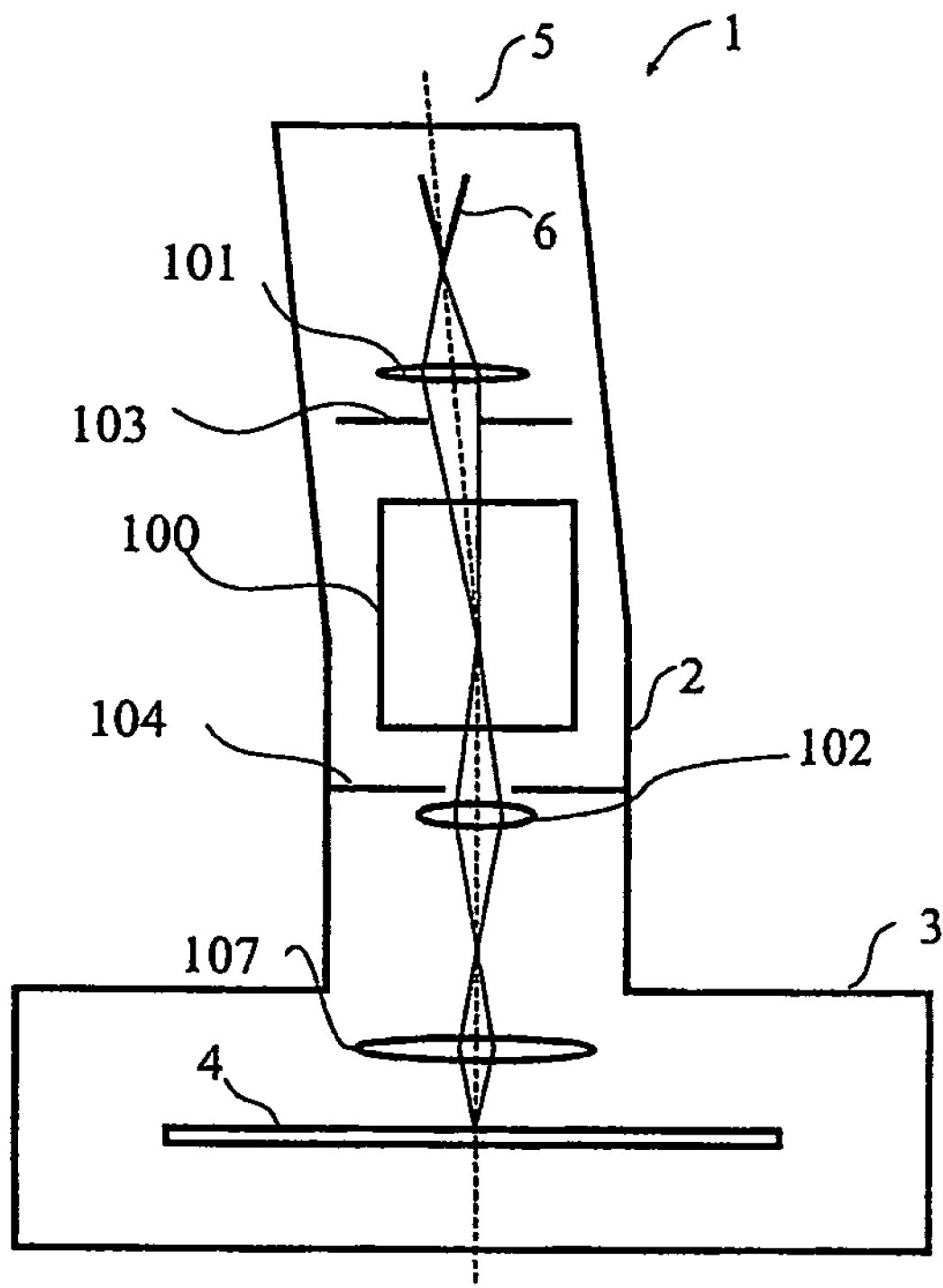
FIG. 11c shows a schematic side view of a further exemplary embodiment of a charged particle beam column with a charged particle beam energy width reduction system.

FIG. 11c mainly correlates to FIG. 11a. However, the optical axis 5 is not straight. In the case of an element acting in a focusing and dispersive manner, the optical axis may be curved. The electrons emitted by emitter 6 are additionally deflected in multipole component 100. Thereby, according to a simplified consideration, the optical axis has two parts which are slightly tilted with respect to each other. The deflection angle could, in the case of a Wien filter element, typically be greater than 0° and smaller than about 30°. Ionized molecules that are accelerated towards emitter 6 within the electron beam column do not have the same beam path as the primary electrons. Thus, emitter-damage may be reduced. This aspect referring to a non-straight vision system may be combined with any of the embodiments described above.

The invention claimed is:

1. Charged particle beam device with a z-axis along an optical axis, comprising:
    a first lens generating a crossover, the crossover having a z-position $z_c$;
    a second lens positioned after the crossover;
    an element acting in a focusing and dispersive manner in an x-z plane, the center of the element acting in a focusing and dispersive manner having essentially the z-position $z_c$;
    a multipole element, which acts in the x-z-plane and the y-z-plane, the center of the multipole element having essentially the z-position $z_c$;
    a first charged particle selection element being positioned in beam direction before the element acting in a focusing and dispersive manner; and
    a second charged particle selection element being positioned in beam direction behind the element acting in a focusing and dispersive manner, wherein the second charged particle selection element is velocity dependent selection element.

2. Charged particle beam device according to claim 1, wherein the element acting in a focusing and dispersive manner is a Wien filter element.

3. The charged particle beam device according to claim 1, wherein the first charged particle selection element is a charged particle angle dependent selection element.

4. The charged particle beam device according to claim 3, wherein the second charged particle selection element is a velocity and angle dependent selection element.

5. The charged particle beam device according to claim 1, wherein the length of the field region of the element acting in a focusing and dispersive manner and the length of the field region of the multipole element are essentially similar.

6. The charged particle beam device according to claim 5. wherein the element acting in a focusing and dispersive manner and the multipole element are suitable for providing in the x-z-plane plane a strictly increasing normalized dispersion as a function of the excitations gl, of the element acting in a focusing and dispersive manner and the multipole element.

7. The charged particle beam device according to claim 6. wherein the element acting in a focusing and dispersive manner and the multipole element are suitable for providing in the x-z- plane a normalized dispersion $x_K/l$ of at least 0.5.

8. The charged particle beam device according to claim 1, wherein the first lens has a position to act as a magnification lens and the second lens has a position to act as a demagnification lens.

9. The charged particle beam device according to claim 8, wherein the first and the second lenses are immersion lenses, and wherein the first lens decelerates the charged particle beam for passing through the element acting in a focusing and dispersive manner and the second lens accelerates the charged particle beam thereafter.

10. The charged particle beam device according to claim 1, wherein the multiple element and the element acting In a focusing and dispersive manner constitute one multipole component.

11. The charged particle beam device according to claim 10, wherein the multipole element comprises a magnetic quadrupole element.

12. The charged particle beam device according to claim 11, wherein the poles of the magnetic quadrupole element are rotated with respect to the poles of the element acting in a focusing and dispersive manner by 45°.

13. The charged particle beam device according to claim 10, wherein the multipole element comprises an electrostatic quadrupole element.

14. The charged particle beam device according to claim 13, wherein the poles of the electrostatic quadrupole element are rotated with respect to the poles of the element acting in a focusing and dispersive manner by 0°.

15. Charged particle beam device according to claim 10, wherein additional deflection or aberration correction elements are superimposed in the multipole component.

16. The charged particle beam device according to claim 11, wherein the first charged particle selection element has a round aperture and the second charged particle selection element has a slit aperture.

17. The charged particle beam device according to claim 11, wherein the first charged particle selection element and the second charged particle selection element have a round aperture.

18. The charged particle beam device according to claim 12, wherein the first lens, the second lens, the element acting in a focusing and dispersive manner and the multipole element form a straight vision system.

19. Method of reducing a charged particle beam velocity distribution width with a system comprising a z-axis along an optical axis, an element acting in a focusing and dispersive manner having essentially a z-position $z_c$, a quadrupole element, a first charged particle selection element and a second charged particle selection element, comprising:

generating a crossover at the position $z_c$ with a first lens;

selecting charged particles with the first charged particle selection element;

exciting the element acting in a focusing and dispersive manner and the quadrupole element;

adjusting the field strength of the element acting in a focusing and dispersive mariner and the quadrupole element so that there is no focusing effect in a x-z-plane and that the charged particle beam appears to originate from the x-y-center-plane of the element acting in a focusing and dispersive manner with respect to a y-z-plane; and velocity dependently selecting charged particles with the second charged particle selection element.

20. Method according to claim 19, wherein the charged particle beam velocity distribution width reduction system is used as a charged particle beam energy width reduction system.

21. Method according to claim 19, wherein the charged particle beam velocity distribution width reduction system is used as a charged particle beam mass selection system.

22. Method according to claim 19, wherein the element acting In a focusing and dispersive manner is a Wien filter element.

23. Method according to claim 19, wherein during the adjusting, the focusing effect of the element acting in a focusing and dispersive manner in the x-y-plane is compensated for and the focusing effect of the quadrupole element in the y-z-plane is adjusted so that the entire focusing of the quadrupole element acts such that the charged particle beam seems to originate from the crossover.

24. Method according to claim 23, wherein the field strengths of the element acting in a focusing and dispersive manner and the quadrupole element are adjusted to a value selected from a plurality of discrete values.

25. Method according to claim 19, further comprising: increasing the field strengths to realize a normalized dispersion $x_K/l$ of at least 0.5.

26. Method according to claim 25, further comprising: illuminating the element acting in a focusing and dispersive manner and the quadrupole element so that a crossover is generated with a z-position that is essentially similar to the z-position of the centers of the field region of the element acting in a focusing and dispersive manner and the field region of the quadrupole element.

27. Method according to claim 26. further comprising: aligning the charged particle beam within the charged particle beam velocity distribution width reduction system so that the charged particle velocities to be selected can be chosen.

* * * * *

UNITED STATES PATENT AND TRADEMARK OFFICE
CERTIFICATE OF CORRECTION

PATENT NO. : 7,468,517 B2 Page 1 of 1
APPLICATION NO. : 10/571345
DATED : December 23, 2008
INVENTOR(S) : Frosien et al.

It is certified that error appears in the above-identified patent and that said Letters Patent is hereby corrected as shown below:

In the Claims:

Column 14, Claim 6, Line 36, please delete "5." and insert --5,-- therefor;

Column 14, Claim 7, Line 42, please delete "6." and insert --6,-- therefor;

Column 14, Claim 10, Line 57, please delete "multiple" and insert --multipole-- therefor;

Column 14, Claim 10, Line 57, please delete "In" and insert --in-- therefor;

Column 15, Claim 19, Line 35, please delete "mariner" and insert --manner-- therefor;

Column 16, Claim 22, Line 11, please delete "In" and insert --in-- therefor.

Signed and Sealed this

Twenty-first Day of April, 2009

JOHN DOLL
*Acting Director of the United States Patent and Trademark Office*